(12) United States Patent
Jindal et al.

(10) Patent No.: US 11,365,475 B2
(45) Date of Patent: Jun. 21, 2022

(54) PHYSICAL VAPOR DEPOSITION CHAMBER CLEANING PROCESSES

(71) Applicant: Applied Materials, Inc., Santa Clara, CA (US)

(72) Inventors: Vibhu Jindal, San Jose, CA (US); Shiyu Liu, Singapore (SG); Sanjay Bhat, Singapore (SG); Shuwei Liu, Singapore (SG); Wen Xiao, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 69 days.

(21) Appl. No.: 16/943,292

(22) Filed: Jul. 30, 2020

(65) Prior Publication Data

US 2021/0032742 A1    Feb. 4, 2021

Related U.S. Application Data

(60) Provisional application No. 62/882,233, filed on Aug. 2, 2019.

(51) Int. Cl.
*H01J 37/32* (2006.01)
*C23C 14/56* (2006.01)

(52) U.S. Cl.
CPC ...... *C23C 14/564* (2013.01); *H01J 37/32862* (2013.01)

(58) Field of Classification Search
CPC combination set(s) only.
See application file for complete search history.

(56) References Cited

U.S. PATENT DOCUMENTS

| 5,861,086 A | * | 1/1999 | Khurana | ........... H01J 37/32082 204/192.32 |
| 7,993,470 B2 | | 8/2011 | West et al. | |

(Continued)

FOREIGN PATENT DOCUMENTS

| EP | 1221357 A1 | 7/2002 |
| JP | 2007214512 A | 8/2007 |
| WO | 2010080069 A2 | 7/2010 |

OTHER PUBLICATIONS

PCT International Search Report and Written Opinion in PCT/US2020/044385 dated Oct. 30, 2020, 15 pages.

*Primary Examiner* — Erin F Bergner
(74) *Attorney, Agent, or Firm* — Servilla Whitney LLC

(57) ABSTRACT

Methods of cleaning a PVD chamber component, for example, process kit components are disclosed. The method comprises at least one of directing a jet of pressurized fluid at a surface of the PVD chamber component, directing pressurized carbon dioxide at the surface of the PVD chamber component, placing the PVD chamber component in a liquid and producing ultrasonic waves in the liquid to further remove contaminants from the surface of the PVD chamber component, using a plasma to clean the surface of the PVD chamber component, subjecting the PVD chamber component to a thermal cycle by heating up to a peak temperature of at least 50° C. and subsequently cooling down to room, placing the PVD chamber component in a process chamber, reducing the pressure in the process chamber below atmospheric pressure and purging the process chamber with a gas, surface conditioning the surface of the PVD chamber component, and drying the surface of the PVD chamber component by directing a gas on the surface of the PVD chamber component.

19 Claims, 3 Drawing Sheets

(56) References Cited

U.S. PATENT DOCUMENTS

| | | | |
|---|---|---|---|
| 2003/0010353 A1 | 1/2003 | Kawasaki et al. | |
| 2005/0056218 A1* | 3/2005 | Sun | C04B 41/91 |
| | | | 118/715 |
| 2005/0172984 A1 | 8/2005 | Schweitzer et al. | |
| 2009/0120462 A1* | 5/2009 | West | B08B 3/02 |
| | | | 134/18 |
| 2010/0051581 A1 | 3/2010 | Chiou et al. | |
| 2011/0100298 A1* | 5/2011 | David | C08J 9/36 |
| | | | 118/723 E |
| 2013/0284373 A1* | 10/2013 | Sun | H01J 37/32477 |
| | | | 156/345.34 |
| 2016/0016286 A1* | 1/2016 | Suh | B24C 1/00 |
| | | | 451/40 |

\* cited by examiner

PHYSICAL VAPOR DEPOSITION CHAMBER CLEANING PROCESSES

CROSS-REFERENCE TO RELATED APPLICATIONS

This application claims priority to U.S. Provisional Application No. 62/882,233, filed Aug. 2, 2020, the entire disclosure of which is hereby incorporated by reference herein.

TECHNICAL FIELD

The present disclosure relates generally to physical vapor deposition process chambers, and in particular, processes for cleaning of physical vapor deposition process chamber components.

BACKGROUND

Sputtering, one common type of physical vapor deposition (PVD), is used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks.

Plasma sputtering may be accomplished using either DC sputtering or RF sputtering. Plasma sputtering typically includes a magnetron positioned at the back of the sputtering target including at least two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Process gases, such as argon, are admitted to the chamber. In the sputtering processes, the sputtering target is bombarded by energetic ions, causing material to be ejected from the target and deposited as a film on a substrate placed in the chamber.

Products manufactured in PVD chambers are often sensitive to any contamination. For example, extreme ultraviolet (EUV) mask blanks are one example of a product manufactured in a PVD process chamber that is sensitive to particulate contamination. In particular, EUV mask blanks have a low tolerance for defects on the working area of the EUV mask blank. Particulate contaminants in the working area of the mask blank are difficult to repair and tend to prevent production of a functioning EUV mask blank. Hydrocarbon contaminants and residual particles formed on the process kits of PVD chambers are major defect sources during PVD deposition of products made in PVD chambers such as EUV mask blanks in multi-cathode systems. Accordingly, there is a need to reduce hydrocarbon contaminants in PVD chambers.

SUMMARY

One or more embodiments of the disclosure are directed to a method of cleaning a PVD chamber component. In one or more embodiments, the method comprises at least one of directing a jet of pressurized fluid at a surface of the PVD chamber component, directing pressurized carbon dioxide at the surface of the PVD chamber component, placing the PVD chamber component in a liquid and producing ultrasonic waves in the liquid to further remove contaminants from the surface of the PVD chamber component, using a plasma to clean the surface of the PVD chamber component, subjecting the PVD chamber component to a thermal cycle by heating up to a peak temperature of at least 50° C. and subsequently cooling down to room temperature, placing the PVD chamber component in a process chamber, reducing the pressure in the process chamber below atmospheric pressure and purging the process chamber with a gas, surface conditioning the surface of the PVD chamber component, and drying the surface of the PVD chamber component by directing a gas on the surface of the PVD chamber component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate is to only a portion of the substrate, unless the context clearly indicates otherwise. Additionally, in some embodiments, reference to depositing on a substrate means both a bare substrate and a substrate with one or more films or features deposited or formed thereon.

Figure 1:
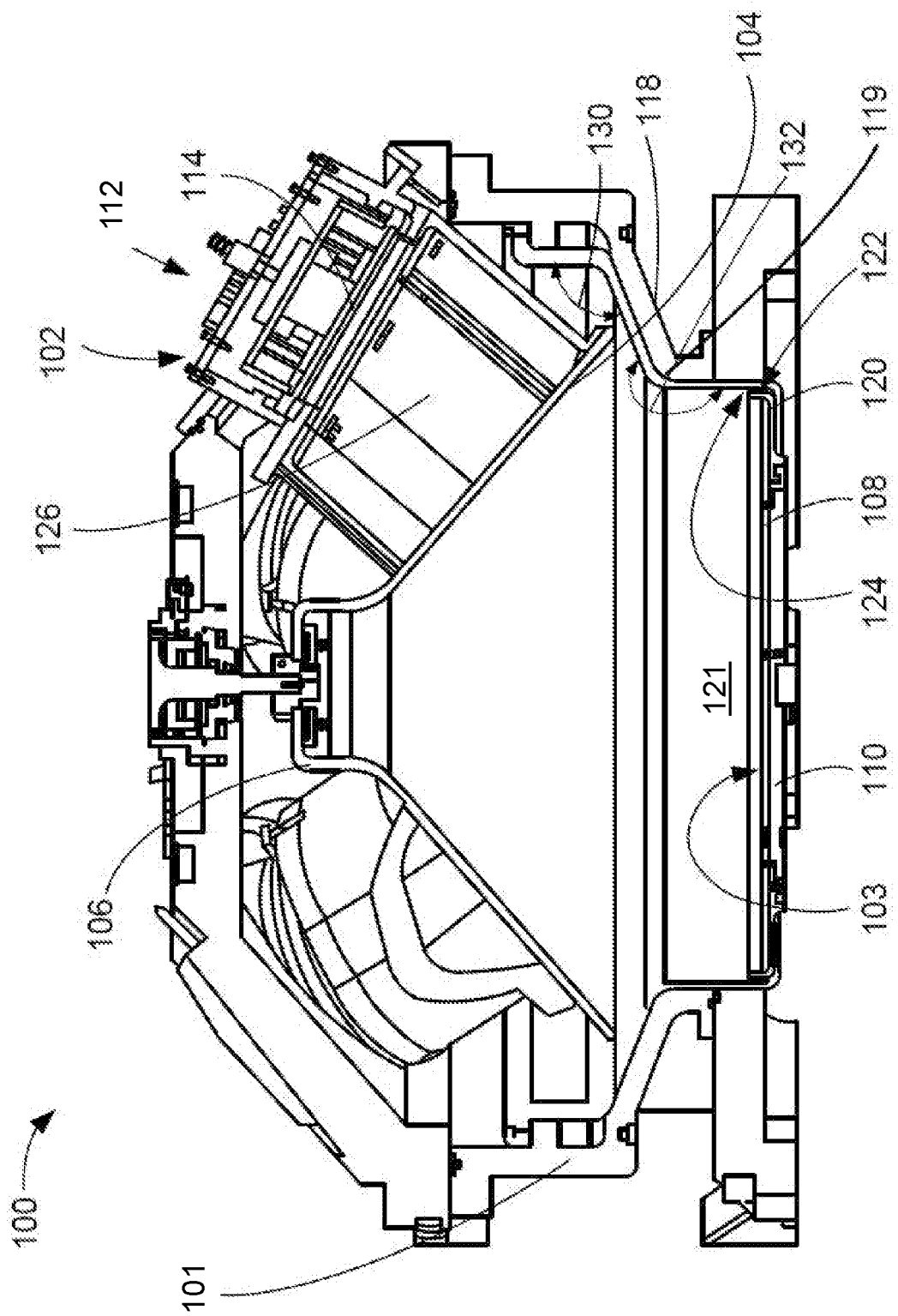
FIG. 1 is a side view of a PVD chamber according to one or more embodiments.
Figure 2:
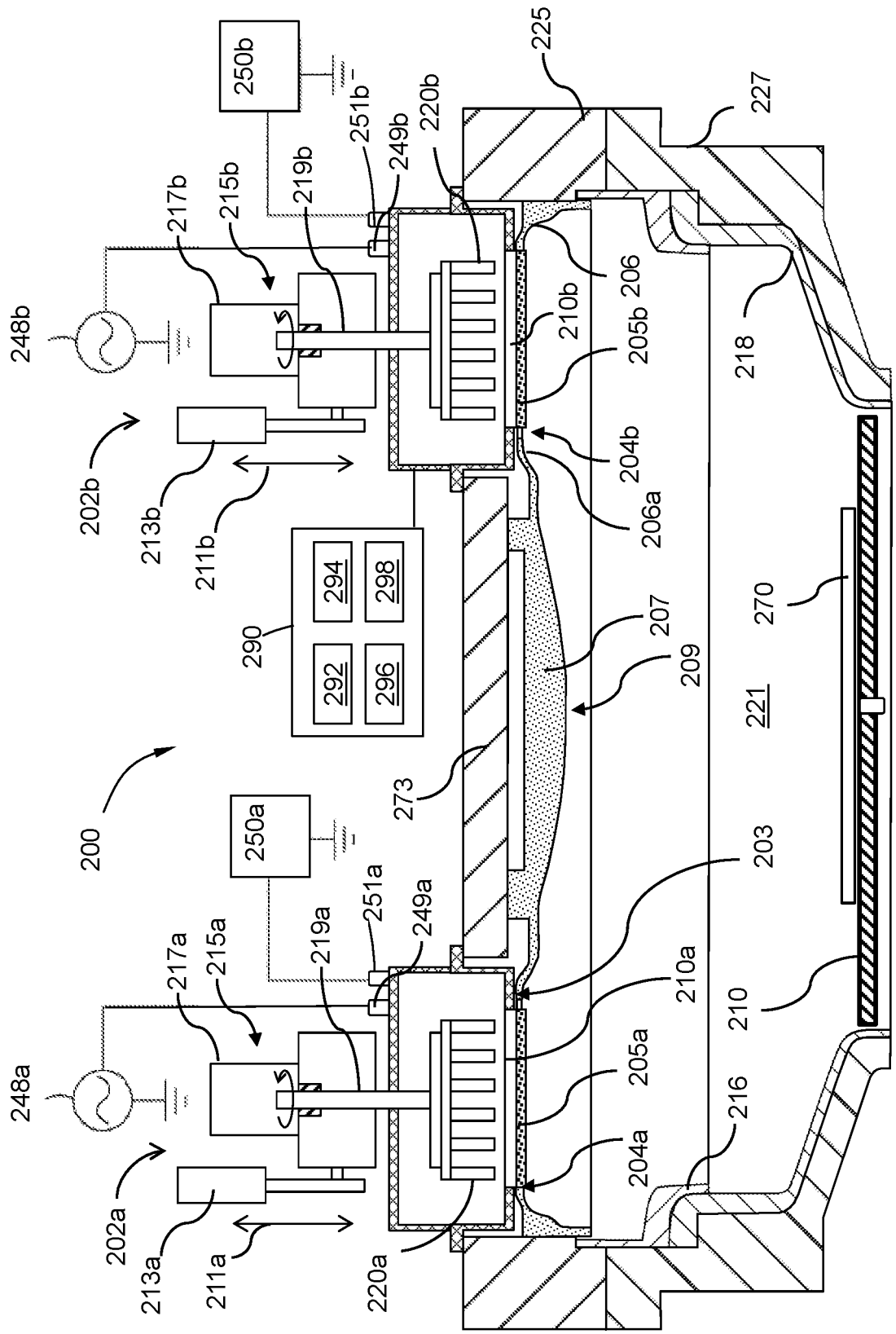
FIG. 2 is a side view of a PVD chamber according to one or more embodiments.

Embodiments of the disclosure pertain to methods of cleaning PVD chamber components of a PVD chamber. FIG. 1 and FIG. 2 are exemplary embodiments of PVD chambers which include PVD chamber components that can be cleaned according to the embodiments disclosed herein. The present disclosure is not limited to the PVD chambers shown in FIG. 1 and FIG. 2.

FIG. 1 shows a PVD chamber 100, which is a multi-cathode PVD chamber 100 including a plurality of cathode assemblies 102. The multi-cathode PVD chamber 100 is shown as including a multi-target PVD source configured to manufacture various devices, for example, a MRAM (magnetoresistive random access memory) or a multi-target PVD source configured to manufacture an extreme ultraviolet (EUV) mask blank, for example a target comprising silicon and a target comprising molybdenum to form a multilayer stack reflective of EUV light.

The multi-cathode PVD chamber 100 comprises a chamber body 101, comprising an adapter (not shown) configured to hold a plurality of cathode assemblies 102 in place in a spaced apart relationship. The multi-cathode PVD chamber 100 can include a plurality of cathode assemblies 102 for PVD and sputtering. Each of the cathode assemblies 102 is connected to a power supply 112, including direct current (DC) and/or radio frequency (RF).

The cross-sectional side view depicts an example of a PVD chamber 100 including the chamber body 101 defining an inner volume 121, where a substrate or carrier is processed. The cathode assemblies 102 in the embodiment shown in FIG. 1 can be used for sputtering different materials as a material layer 103. The cathode assemblies 102 exposed through shield holes 104 of an upper shield 106, which is disposed over the substrate or carrier 108 on a rotating pedestal 110. The upper shield 106 is generally conical in shape. There may generally be only one carrier 108 over or on the rotating pedestal 110.

The substrate or carrier 108 is shown as a structure having a semiconductor material used for fabrication of integrated circuits. For example, the substrate or carrier 108 comprises a semiconductor structure including a wafer. Alternatively, the substrate or carrier 108 can be another material, such as an ultra low expansion glass substrate used to form an EUV mask blank. The substrate or carrier 108 can be any suitable shape such as round, square, rectangular or any other polygonal shape.

The upper shield 106 is formed with the shield holes 104 so that the cathode assemblies 102 can be used to deposit the material layers 103 through the shield holes 104. A power supply 112 is applied to the cathode assemblies 102. The power supply 112 can include a direct current (DC) or radio frequency (RF) power supply.

The upper shield 106 is configured to expose one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber can be compact. The targets 114 can be any suitable size. For example, each of the targets 114 can be a diameter in a range of from about 4 inches to about 20 inches, or from about 4 inches to about 15 inches, or from about 4 inches to about 10 inches, or from about 4 inches to about 8 inches or from about 4 inches to about 6 inches.

In FIG. 1, the substrate or carrier 108 is shown as being on the rotating pedestal 110, which can vertically move up and down. Before the substrate or carrier 108 moves out of the chamber, the substrate or carrier 108 can move below a lower shield 118. A telescopic cover ring 120 abuts the lower shield 118. Then, the rotating pedestal 110 can move down, and then the carrier 108 can be raised with a robotic arm before the carrier 108 moves out of the chamber.

When the material layers 103 are sputtered, the materials sputtered from the targets 114 can be retained inside and not outside of the lower shield 118. In this prior art embodiment, telescopic cover ring 120 includes a raised ring portion 122 that curves up and has a predefined thickness. The telescopic cover ring 120 can also include a predefined gap 124 and a predefined length with respect to the lower shield 118. Thus, the materials that form material layers 103 will not be below the rotating pedestal 110 thereby eliminating contaminants from spreading to the substrate or carrier 108.

The chamber includes shrouds 126 which can be designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects.

The shrouds 126 can be designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not be deposited on the substrate or carrier 108. For example, a first cathode assembly and a second cathode assembly can apply alternating layers of different materials in the formation of an extreme ultraviolet mask blank, for example, alternating layers of silicon deposited from a first target and cathode assembly 102 and a molybdenum from a second target and cathode assembly 102.

The substrate or carrier 108 can be coated with uniform material layer 103 deposited on a surface of the substrate or carrier 108 using the deposition materials including a metal from the targets 114 over the shrouds 126. Then, the shrouds 126 can be taken through a recovery process. The recovery process not only cleans the shrouds 126 but also recovers a residual amount of the deposition materials remained on or in the shrouds 126. For example, there may be molybdenum on one of the shrouds 126 and then silicon on another of the shrouds 126. Since molybdenum is more expensive than silicon, the shrouds 126 with molybdenum can be sent out for the recovery process. As shown in FIG. 1, the lower shield 118 is provided with a first bend resulting from small angle 130 and a second bend resulting from large angle 132, which results in a knee 119 in the lower shield 118.

FIG. 2 depicts another embodiment of a PVD chamber 200, which includes a plurality of cathode assemblies 202a and 202b. While only two cathode assemblies 202a and 202b are shown in the side view of FIG. 2, a multi-cathode chamber can comprise more than two cathode assemblies, for example, five, six or more than six cathode assemblies. An upper shield 206 is provided below the plurality of cathode assemblies 202a and 202b, the upper shield 206 having two shield holes 204a and 204b to expose targets 205a, 205b disposed at the bottom of the cathode assemblies 202a to the interior space 221 of the PVD chamber 200.

The PVD chamber 200 in FIG. 2 comprises a modular chamber body, in which an intermediate chamber body 225 is located above and adjacent a lower chamber body 227. The intermediate chamber body 225 is secured to the lower chamber body 227 to form the modular chamber body, which surrounds lower shield 218 and the middle shield 216. A top adapter lid (not shown) is disposed above intermediate chamber body 225 to surround upper shield 206.

PVD chamber 200 is also provided with a rotating pedestal 210 similar to rotating pedestal 110 in FIG. 1. A person of ordinary skill will readily appreciate that other components of a PVD chamber, such as those referenced above in FIG. 1 but omitted in FIG. 2 for the sake of clarity, are provided in PVD chamber 200 according to one or more embodiments. It will be appreciated that the upper shield 206 of the PVD chamber 200 of FIG. 2 is substantially flat, compared to the conical upper shield 106 of FIG. 1.

The upper shield 206 includes a raised area 209 in the region 207 between the first shield hole and the second shield hole, the raised area. The PVD chamber 200 is configured to alternately sputter material from the first target 205a and the second target 205b without rotating the upper shield 206.

In one or more embodiments, the raised area 209 has a height H so that during a sputtering process, the raised area height H is sufficient to prevents material sputtered from the first target 205a from being deposited on the second target 205b and to prevent material sputtered from the second target 205b from being deposited on the first target 205a.

According to one or more embodiments of the disclosure, the first cathode assembly 202a comprises a first magnet spaced apart from the first backing plate 210a, and the second cathode assembly 202b comprises a second magnet 220b, wherein the first magnet 220a and the second magnet 220b are movable as indicated by arrow 211b by a linear actuator 213a and a linear actuator 213b. The linear actuator 213a and the linear actuator 213b can comprise any suitable device that can respectively effect linear motion of first magnet assembly 215a and second magnet assembly 215b. First magnet assembly 215a includes rotational motor 217a, which can comprise a servo motor to rotate the first magnet 220a via shaft 219a coupled to rotational motor 217a. Second magnet assembly 215b includes rotational motor 217b, which can comprise a servo motor to rotate the second magnet 220b via shaft 219b coupled to rotational motor 217b. It will be appreciated that the first magnet assembly 215a may include a plurality of magnets in addition to the first magnet 220a. Similarly, the second magnet assembly 215b may include a plurality of magnets in addition to the second magnet 220b.

In some embodiments, the first target 205a comprises a molybdenum target and the second target 205b comprises a silicon target, and the PVD chamber 200 further comprises a third cathode assembly (not shown) including a third backing plate to support a third target 205 (not shown) and a fourth cathode assembly (not shown) including a fourth backing plate configured to support a fourth target (not shown). The third cathode assembly and fourth cathode assembly according to one or more embodiments are configured in the same manner as the first and second cathode assemblies 202a, 202b as described herein.

Plasma sputtering may be accomplished using either DC sputtering or RF sputtering in the PVD chamber 200. In some embodiments, the process chamber includes a feed structure for coupling RF and DC energy to the targets associated with each cathode assembly. For cathode assembly 202a, a first end of the feed structure can be coupled to an RF power source 248a and a DC power source 250a, which can be respectively utilized to provide RF and DC energy to the target 205a. The RF power source 248a is coupled to RF power in 249a and the DC power source 250a is coupled to DC power in 251a. For example, the DC power source 250a may be utilized to apply a negative voltage, or bias, to the target 305a. In some embodiments, RF energy supplied by the RF power source 248a may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

Likewise, for cathode assembly 202b, a first end of the feed structure can be coupled to an RF power source 248b and a DC power source 250b, which can be respectively utilized to provide RF and DC energy to the target 205b. The RF power source 248b is coupled to RF power in 249a and the DC power source 250b is coupled to DC power in 251b. For example, the DC power source 250b may be utilized to apply a negative voltage, or bias, to the target 205b. In some embodiments, RF energy supplied by the RF power source 248b may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

While the embodiment shown includes separate RF power sources 248a and 248b for cathode assemblies 202a and 202b, and separate DC power sources 250a and 250b for cathode assemblies 202a and 202b, the PVD chamber can comprise a single RF power source and a single DC power source with feeds to each of the cathode assemblies.

The PVD chamber 100 shown in FIG. 1 and the PVD chamber 200 shown in FIG. 2 include removable PVD chamber components that are exposed to contamination during PVD processes. These removable PVD chamber components may collectively be referred to as a "process kit." Thus in FIG. 1, the process kit includes at least the upper shield 106, lower shield 118 and the telescopic cover ring 120. In FIG. 2, the process kit may include the upper shield 206, the middle shield 216, and the lower shield 218. The process kit according to some embodiments may further comprise components of the PVD chamber 100 and PVD chamber 200 such as a bottom liner, deposition rings and a target backing plate shield.

According to one or more embodiments, a process of cleaning removable PVD chamber components is provided. Hydrocarbon contaminants and residual particles on the removable PVD chamber components such as process kits are major defect sources during PVD deposition processes, particularly in multi-cathode PVD chambers of the type shown in FIG. 1 and FIG. 2. For example, during EUV mask blank manufacture, hydrocarbon contaminants readily evaporate from the heated PVD chamber components and redeposit on the EUV mask blanks to form carbon rich particles. Residual particles loosely bonded to PVD chamber component surfaces may drop onto the mask blanks due to cyclic thermal stresses and mechanical vibrations. The presence of contamination and loose particles reduces the adhesion strength of deposits on the PVD chamber components, leading to delamination of the deposits, which fall onto the mask blanks as defects. It was determined that existing cleaning processes are not effective to remove defect sources in PVD chambers.

In some embodiments, the PVD chamber 200 is equipped with a controller 290. There may be a single controller or multiple controllers. When there is more than one controller, each of the controllers is in communication with each of the other controllers to control of the overall functions of the PVD chamber 200. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller can comprise processor 292, a memory 294 coupled to the processor, input/output devices coupled to the processor 292, and support circuits 296 and 298 to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The PVD chambers 100 and 200 and methods described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer can be formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon are formed by physical vapor deposition, for example, in a multi-cathode source chamber as described herein. In one or more embodiments, the chambers and the methods described herein can be used to deposit a multilayer stack of 20-60 reflective pairs of molybdenum and silicon.

Figure 3:
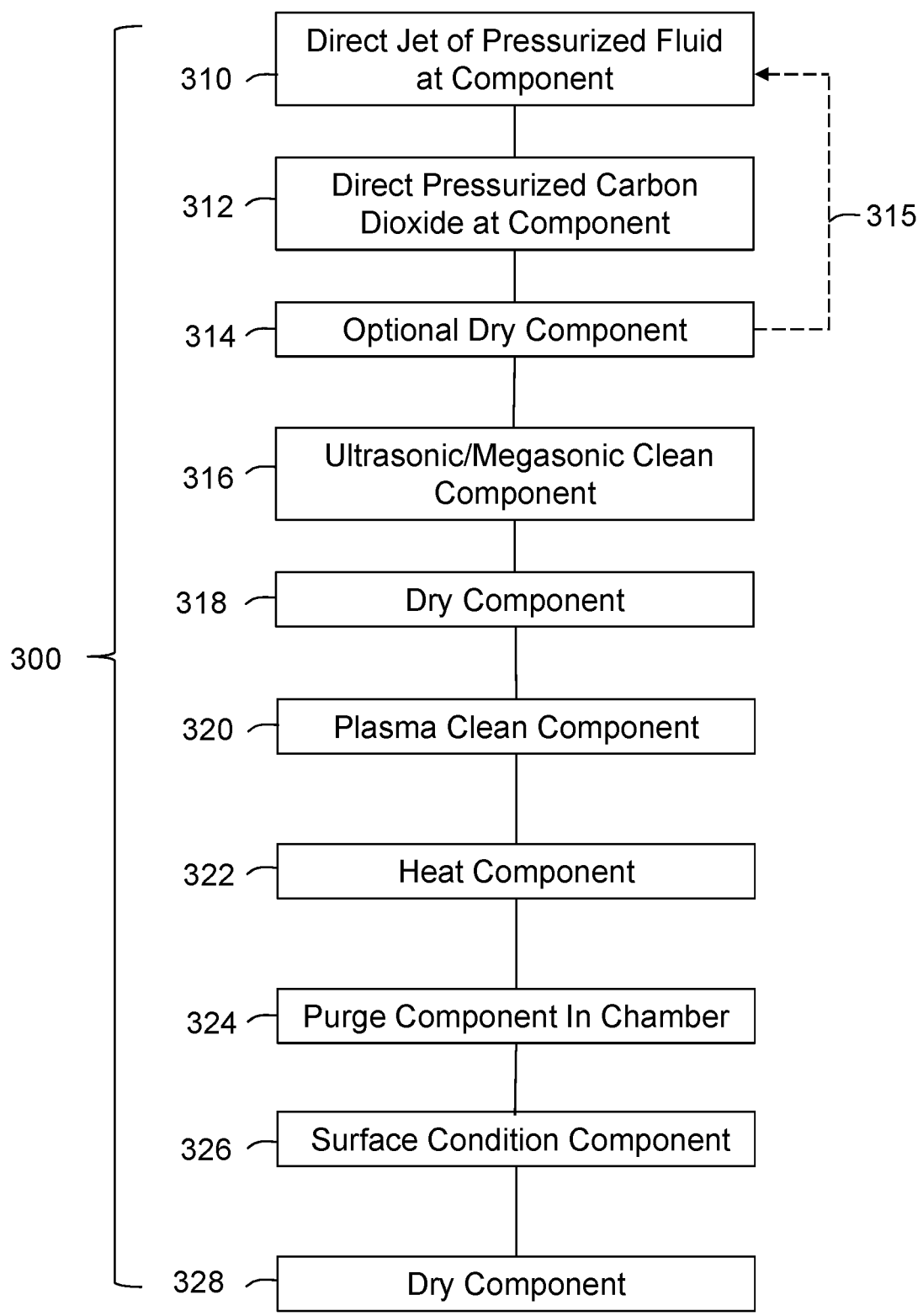
FIG. 3 illustrates step of a process for cleaning a PVD chamber component according to one or more embodiments.

Referring now to FIG. 3, which is a flow chart showing steps of a method 300 of cleaning a PVD chamber component according to one or more embodiments of the disclosure. In one or more embodiments, PVD chamber components such as process kit components can be removed from the PVD chamber and cleaned according to methods described herein.

The method according to one or more embodiments comprises a step 310 of directing a jet of pressurized fluid at a surface of the PVD chamber component. The method according to one or more embodiments further comprises a step 312 of directing pressurized carbon dioxide at the surface of the PVD chamber component. The method according to one or more embodiments further comprises a step 314 of optionally drying the PVD chamber component. Steps 310, 312 and 314 may be repeated one to 10 times before proceeding to step 316.

The method according to one or more embodiments further comprises a step 316 of placing the PVD chamber component in a liquid and producing ultrasonic waves in the liquid to further remove contaminants from the surface of the PVD chamber component. Any suitable ultrasonic or megasonic cleaning apparatus can be used according to embodiments of the disclosure. The cleaning medium used in ultrasonic cleaning according to one or more embodiments comprises deionized water. The method according to one or more embodiments further comprises a step 318 of drying the component after step 316. The method according to one or more embodiments further comprises a step 320 of using a plasma to clean the surface of the PVD chamber component. The method according to one or more embodiments further comprises a step 322 of subjecting the PVD chamber component to a thermal cycle by heating up to a peak temperature in a range of from at least 50° C. to about 40% of the PVD chamber component melting temperature and subsequently cooling the PVD chamber component to room temperature. In one or more embodiments, room temperature is 25° C. The method according to one or more embodiments further comprises a step 324 of placing the PVD chamber component in a process chamber, reducing the pressure in the process chamber below atmospheric pressure and purging the process chamber with a gas. The method according to one or more embodiments further comprises a step 326 of surface conditioning the surface of the PVD chamber component. The method according to one or more embodiments further comprises a step 328 of drying the surface of the PVD chamber component by directing a gas on the surface of the PVD chamber component. According to one or more embodiments of the disclosure, the steps 310, 312, 314, 316, 318, 320, 322, 324, 326 and 328 are performed sequentially, in order as shown. As noted above, according to one or more embodiments, the steps 310, 312 and 314 may be repeated one to 10 times before proceeding to step 316.

Thus, according to a first embodiment of the instant disclosure, a method of cleaning a PVD chamber component comprises directing a jet of pressurized fluid at a surface of the PVD chamber component; directing pressurized carbon dioxide at the surface of the PVD chamber component; placing the PVD chamber component in a liquid and producing ultrasonic waves in the liquid to further remove contaminants from the surface of the PVD chamber component; removing the PVD chamber components from the liquid and drying the surface of the PVD chamber component; using a plasma to clean the surface of the PVD chamber component; subjecting the PVD chamber component to a thermal cycles by heating up to a peak temperature of at least 50° C. and subsequently cooling down to room temperature; placing the PVD chamber component in a process chamber, reducing the pressure in the process chamber below atmospheric pressure and purging the process chamber with a gas; surface conditioning the surface of the PVD chamber component; and drying the surface of the PVD chamber component by directing a gas on the surface of the PVD chamber component.

In a second embodiment, the first embodiment is such that the method removes hydrocarbon contamination from the surface of the PVD chamber component. In a third embodiment, the method is such that the PVD chamber component of the first or second embodiment is selected from the group consisting of a liner, a deposition ring and a shield.

In a fourth embodiment, any of the first through third embodiments are modified so that the gas used to purge the process chamber to dry the surface of the PVD chamber component comprises an inert gas or compressed dry air. In a fifth embodiment, any of the first through fourth embodiments is such that the jet of pressurized fluid comprises a water jet, and in a sixth embodiment, process includes directing the water jet at a pressure in a range of from 500 psi to 2500 psi (344738 Pa to 17.23 MPa). In a seventh embodiment, any of the first through sixth embodiments are such that the jet of fluidized pressure is at an angle in a range of from about 15 degrees to about 75 degrees from the surface of the PVD chamber component and at a distance in a range of from about 3 cm to about 15 cm from the surface of the PVD chamber component. In any of these embodiments, the cleaning time can be in a range of from 2 to 10 s/cm² of surface area.

In an eighth embodiment, any of the first through seventh embodiments is such that the pressurized carbon dioxide directs dry ice particles or liquid carbon dioxide at the surface of the PVD chamber component. In a ninth embodiment, any of the first through eighth embodiments is such that the pressurized carbon dioxide is at an angle in a range of from about 10 degrees to about 80 degrees from the surface of the PVD chamber component and at a distance from the surface in a range of from about 3 cm to about 25 cm from the surface of the PVD chamber component. In any of these embodiments, the carbon dioxide flow rate is in a range of from 0.05 kg/min to about 1 kg/min and a cleaning time of 1 to 50 s/cm² of surface area.

In a tenth embodiment, any of the first through ninth embodiments are such that the pressurized carbon dioxide directs dry ice directed at the surface of the PVD chamber component at a pressure in the range of about 10 psi to about 150 psi. In an eleventh embodiment, any of the first through ninth embodiments are such that the pressurized carbon dioxide directs liquid carbon dioxide directed at the surface of the PVD chamber component at a pressure in the range of about 200 psi to about 800 psi.

In a twelfth embodiment, heating the PVD chamber component comprises heating the PVD chamber component to a temperature in a range of from 100° C. to less than 40 percent of the PVD chamber component melting temperature for a time in a range of from about 10 minutes to about 40 minutes. In some embodiments, the drying time typically range from 20 minutes to a few hours, but in some embodiments, typically 120° C. to 300° C. is used for Al based process kit components.

In a thirteenth embodiment, any of the first through twelfth embodiments are modified such that placing the PVD chamber component in a process chamber, reducing the pressure in the process chamber to well below atmospheric pressure, (typically <10E⁻⁵ Torr) and purging the process chamber with a gas to maintain the pressure in the process chamber at $10E^{-4}$ to $10E^{-2}$ Torr, and heating the PVD chamber component to a temperature less than 40 percent of the PVD chamber component melting temperature for a time in a range of from about 10 minutes to about 40 minutes. The PVD chamber component is then cooled to room temperature. This step can be performed in a semiconductor processing chamber. The purging can involve a chamber pump down to ~$10E^{-4}$ Torr and then purging to atmospheric pressure with nitrogen, argon or compressed dry air. In some embodiments, there can be a process step of combined thermal cycling and pump purge, in which the chamber is pumped down to ~$10E^{-4}$ Torr, heating to peak temperature of at least 50° C. but not exceeding 4/10 the melting temperature of the PVD chamber component material. A typical range is 120° C. to 300° C. Al based process kit components. The peak temperature is held for 10-40 min, and then the chamber is purged to atmosphere pressure with nitrogen, argon or compressed dry air. The thermal cycling and pump purge is typically repeated for 1-20 cycles but could be increased as required to achieve optimum results.

Thus, in a fourteenth embodiment, any of the first through thirteenth embodiments, reducing the pressure in the process chamber and heating the PVD chamber component is repeated at least once and up to twenty cycles. In a fifteenth embodiment, any of the first through fourteenth embodiments are such that surface conditioning and drying the PVD chamber component comprises utilizing a reactive plasma at a temperature of temperature less than 40 percent of the PVD chamber component melting temperature, at a pressure in a range of from 0.1 mTorr to about 0.5 Torr and the plasma comprises a gas selected from the group consisting of reactive gases such as oxygen and nitrogen, inert gases such as argon and krypton, and a combination of reactive and inert gases. The bias voltage can be in a range of 50 V to 100 V. In a sixteenth embodiment, any of the first through fifteenth embodiments is such that the step of drying the surface of the PVD chamber component by directing a gas on the surface of the PVD chamber component comprises using a gas selected from the group consisting of argon, nitrogen, and compressed dry air at a pressure in the range of from 2 bar to about 10 bar.

According to one of more embodiments, the carbon dioxide cleaning and ultrasound cleaning mechanically break the bond between loose particles and the PVD chamber component, resulting in the removal of the particles. Plasma cleaning makes use of energetic ions to physically and chemically etch away adsorbed contaminants, and is especially effective for hydrocarbons. While the present disclosure is not bound by a particular principle of operation, thermal cycling and pump purge cause fast and cyclic expansion and contraction of the process kits, helping to "shake off" particles attached to the surface of the PVD chamber component. The effectiveness of thermal cycling is determined by the temperature achieved, which controls the thermal strain exerted to the process kits. However, the temperature should be limited to be below 0.4 of the PVD component materials melting temperature to reduce the risk of thermally induced deformations.

Experimental observation utilizing the process shown in FIG. 3 showed a significant reduction in flakes and particles. Hydrocarbon contaminated wafer treated by plasma cleaning with the following parameters were successful in significant reduction in hydrocarbon contaminants observed after 40 minutes of plasma cleaning. A reduction of 49% in total adders and a reduction of 52% of adders greater than 35 nm in size was observed using the parameters in Table 1:

TABLE 1

| Hollow cathode gas supply (sccm) | | Ar: 10 |
|---|---|---|
| Ion source gas supply | Inert Mode (sccm) 20 min clean time | Ar: 15-17 |
| | Reactive Mode (sccm) 20 min clean time | Ar: 7-9 O2: 5 |
| Process pressure (mTorr) | | 0.5-0.6 |
| Discharge voltage (V) | | 72 |
| Discharge current (A) | | 5.5 |
| Distance from ion source to sample | | Approx. 90 cm |

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of cleaning a PVD chamber component, the method comprising:

directing a jet of pressurized fluid at a surface of the PVD chamber component to remove contaminants generated during operation of the PVD chamber, the contaminants including hydrocarbons and residual particles;

directing pressurized carbon dioxide at the surface of the PVD chamber component to further remove the contaminants;

placing the PVD chamber component in a liquid and producing ultrasonic waves in the liquid to further remove the contaminants from the surface of the PVD chamber component;

removing the PVD chamber component from the liquid and drying the surface of the PVD chamber component;

using a plasma to cause energetic ions to physically and chemically clean the contaminants from the surface of the PVD chamber component;

heating the PVD chamber component to a peak temperature of at least 50° C.;

placing the PVD chamber component in a process chamber, reducing the pressure in the process chamber below atmospheric pressure and purging the process chamber with a gas;

surface conditioning the surface of the PVD chamber component; and directing a gas on the surface of the PVD chamber component.

2. The method of claim 1, wherein the PVD chamber component is selected from the group consisting of a liner, a deposition ring and a shield.

3. The method of claim 1, wherein the gas used to purge the process chamber comprises an inert gas or compressed dry air.

4. The method of claim 3, wherein the jet of pressurized fluid comprises a water jet.

5. The method of claim 4, wherein the directing the jet of fluid comprises directing the water jet at a pressure in a range of from 500 psi to 2500 psi.

6. The method of claim 5, wherein the water jet is at an angle in a range of from about 15 degrees to about 75 degrees from the surface of the PVD chamber component and at a distance from the surface in a range of from about 3 cm to about 15 cm from the surface of the PVD chamber component.

7. The method of claim 1, wherein the pressurized carbon dioxide directs dry ice particles or liquid carbon dioxide at the surface of the PVD chamber component.

8. The method of claim 7, wherein the pressurized carbon dioxide is at an angle in a range of from about 10 degrees to about 80 degrees from the surface of the PVD chamber component and at a distance from the surface in a range of from about 3 cm to about 25 cm from the surface of the PVD chamber component.

9. The method of claim 8, wherein the pressurized carbon dioxide directs dry ice directed at the surface of the PVD chamber component at a pressure in the range of about 10 psi to about 150 psi.

10. The method of claim 8, wherein the pressurized carbon dioxide directs liquid carbon dioxide directed at the surface of the PVD chamber component at a pressure in the range of about 200 psi to about 800 psi.

11. The method of claim 1, wherein heating the PVD chamber component comprises heating the PVD chamber component to a temperature less than 40 percent of the PVD chamber component melting temperature for a time in a range of from about 10 minutes to about 40 minutes.

12. The method of claim 1, wherein placing the PVD chamber component in a process chamber, reducing the pressure in the process chamber below atmospheric pressure and purging the process chamber with a gas comprises reducing pressure in the process chamber to $10E^{-4}$ Torr, and heating the PVD chamber component to a temperature less than 40 percent of the PVD chamber component melting temperature for a time in a range of from about 10 minutes to about 40 minutes.

13. The method of claim 12, wherein reducing the pressure in the process chamber and heating the PVD chamber component is repeated at least once and up to twenty cycles.

14. The method of claim 1, wherein surface conditioning the PVD chamber component comprises utilizing a reactive plasma at a temperature of less than 40 percent of the PVD chamber component melting temperature, at a pressure in a range of from 0.1 mTorr to about 0.5 Torr and the plasma comprises a gas selected from the group consisting of oxygen, nitrogen, argon, krypton, and a combination thereof.

15. The method of claim 14, further comprising directing a gas on the surface of the PVD chamber component using a gas selected from the group consisting of argon, nitrogen, and compressed dry air at a pressure in the range of from 2 bar to about 10 bar.

16. A method of cleaning a PVD chamber component, the method comprising:
    directing a waterjet of at a surface of the PVD chamber component at a pressure in a range of from 500 psi to 2500 psi to remove contaminants generated during operation of the PVD chamber, the contaminants including hydrocarbons and residual particles;
    directing pressurized carbon dioxide at the surface of the PVD chamber component to direct dry ice at the surface of the PVD chamber component at a pressure in a range of from 10 PSI to about 150 PSI to further remove the contaminants;
    placing the PVD chamber component in a liquid and producing ultrasonic waves in the liquid to further remove the contaminants from the surface of the PVD chamber component;
    removing the PVD chamber component from the liquid and drying the surface of the PVD chamber component;
    using a plasma to cause energetic ions to physically and chemically clean the contaminants from the surface of the PVD chamber component, the plasma comprising an inert gas and a reactive gas and a plasma energy of in a range of from about 5 eV to about 150 eV;
    subjecting the PVD chamber component to a thermal cycle by heating up to a peak temperature in a range of from at least 50° C. to about 40% of the PVD chamber component melting temperature and subsequently cooling the PVD chamber component to room temperature;
    placing the PVD chamber component in a process chamber, reducing the pressure in the process chamber below atmospheric pressure and purging the process chamber with an inert gas; surface conditioning the surface of the PVD chamber component with a reactive plasma; and
    directing a gas at the surface of the PVD chamber component.

17. The method of claim 16, wherein the gas directed at the surface of the PVD chamber component is selected from the group consisting of argon, nitrogen and compressed dry air at a pressure of from about 2 bar to about 10 bar.

18. The method of claim 16, wherein the reactive plasma used during surface conditioning comprises a gas selected from the group consisting of oxygen, nitrogen, argon, krypton, and a combination thereof.

19. A method of cleaning a PVD chamber component, the method comprising:
    directing a waterjet of at a surface of the PVD chamber component at a pressure in a range of from 500 psi to 2500 psi to remove contaminants generated during operation of the PVD chamber, the contaminants including hydrocarbons and residual particles;
    directing pressurized carbon dioxide at the surface of the PVD chamber component to direct dry ice at the surface of the PVD chamber component at a pressure in a range of from 10 PSI to about 150 PSI to further remove the contaminants;
    placing the PVD chamber component in a liquid and producing ultrasonic waves in the liquid to further remove the contaminants from the surface of the PVD chamber component;
    removing the PVD chamber component from the liquid and drying the surface of the PVD chamber component;
    using a plasma to cause energetic ions to physically and chemically clean the contaminants from the surface of the PVD chamber component, the plasma comprising an inert gas and a reactive gas and a plasma energy of in a range of from about 5 eV to about 150 eV;
    subjecting the PVD chamber component to a thermal cycle by heating up to a peak temperature in a range of from at least 50° C. to about 40% of the PVD chamber component melting temperature and subsequently cooling the PVD chamber component to room temperature;
    placing the PVD chamber component in a process chamber, reducing the pressure in the process chamber below atmospheric pressure and purging the process chamber with an inert gas; surface conditioning the surface of the PVD chamber component with a reactive plasma comprising a gas selected from the group consisting of oxygen, nitrogen, a combination of oxygen and argon and a combination of nitrogen and argon; and
    directing a gas at the surface of the PVD chamber component, the gas selected from the group consisting of argon, nitrogen and compressed dry air at a pressure of from about 2 bar to about 10 bar.

* * * * *